(12) United States Patent
Uchiyama et al.

(10) Patent No.: US 10,420,230 B2
(45) Date of Patent: Sep. 17, 2019

(54) SUPPORT, ELECTRONIC DEVICE, AND METHOD FOR MANUFACTURING THE SAME

(71) Applicant: LENOVO (SINGAPORE) PTE. LTD., Singapore (SG)

(72) Inventors: Yoshiharu Uchiyama, Yokohama (JP); Shigehiro Horiuchi, Yokohama (JP); Shigeki Mori, Yokohama (JP); Tetsuya Ohtani, Yokohama (JP); Hiroaki Agata, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 10 days.

(21) Appl. No.: 15/675,100

(22) Filed: Aug. 11, 2017

(65) Prior Publication Data
US 2018/0077809 A1  Mar. 15, 2018

(30) Foreign Application Priority Data

Sep. 13, 2016 (JP) ................................ 2016-178871

(51) Int. Cl.
*F16M 1/00* (2006.01)
*H05K 5/02* (2006.01)
*G06F 1/16* (2006.01)

(52) U.S. Cl.
CPC ............ *H05K 5/0204* (2013.01); *G06F 1/166* (2013.01); *G06F 1/1616* (2013.01); *H05K 5/023* (2013.01); *H05K 5/0234* (2013.01)

(58) Field of Classification Search
CPC .... H05K 5/0204; H05K 5/023; H05K 5/0234; G06F 1/1616
USPC ......... 248/188.8, 188.9, 615, 632, 677, 688; 361/679.26–679.3
See application file for complete search history.

(56) References Cited

U.S. PATENT DOCUMENTS

| | | | | |
|---|---|---|---|---|
| 5,295,652 A | * | 3/1994 | Byrne ................ | B60G 21/0551 16/2.1 |
| 6,431,585 B1 | * | 8/2002 | Rickabus .............. | B60R 21/215 24/114.05 |
| 2006/0290155 A1 | * | 12/2006 | Smith ..................... | B60R 11/00 296/29 |
| 2008/0253081 A1 | * | 10/2008 | Tracy .................... | G06F 1/1616 361/679.5 |
| 2010/0064944 A1 | * | 3/2010 | Su ........................ | H05K 5/0234 108/50.01 |
| 2013/0075550 A1 | * | 3/2013 | Chiu .................... | H05K 5/0234 248/188.9 |

FOREIGN PATENT DOCUMENTS

JP            2003167644 A        6/2003

* cited by examiner

*Primary Examiner* — Gwendolyn W Baxter
(74) *Attorney, Agent, or Firm* — Shimokaji IP (57) ABSTRACT

A support can be easily attached to and is less likely to separate from an opening of a chassis of an electronic device. The support has a first elastic member having a recessed portion and configured to be fitted into the opening so that an opening surface of the recessed portion is directed to an inside of the chassis, and a second member having a protruding portion configured to be fitted into the recessed portion of the first member.

11 Claims, 10 Drawing Sheets

SUPPORT, ELECTRONIC DEVICE, AND METHOD FOR MANUFACTURING THE SAME

FIELD OF THE INVENTION

The present invention relates to a support, an electronic device, and a method for manufacturing the same.

BACKGROUND OF THE INVENTION

In general, a support, such as a rubber leg, is attached to the bottom surface of a chassis of an electronic device, such as a Laptop PC, for the purpose of preventing slipping or rattling, shock absorption, and the like of an electronic device (for example, Patent Document 1).

[Patent Document 1] Japanese Patent Application Laid-Open No. 2003-167644

SUMMARY OF THE INVENTION

However, such attachment of the rubber leg to the chassis surface is performed with a double-stick tape or an adhesive. Or, a part of the rubber leg is thermally fused into a hole or the like in the bottom surface of the chassis to be attached. Therefore, the adhesion between the rubber leg and the chassis bottom surface decreases with progress of time, which sometimes results in the separation of the rubber leg. Moreover, an operation of attaching the rubber leg to the chassis bottom surface has become complicated.

Then, it is an object of the present invention to provide a support which is easily attached to and is less likely to separate from a chassis of an electronic device, an electronic device, and a method for manufacturing the same.

In order to achieve the above-described object, in one aspect, a support is attached to an opening of a chassis of an electronic device, and the support has a first elastic member having a recessed portion and configured to be fitted into the opening so that the opening surface of the recessed portion is directed to the inside of the chassis and a second member having a protruding portion configured to be fitted into the recessed portion of the first member.

An electronic device, in one aspect, has a chassis having an opening and a support, in which the support has a first elastic member which has a recessed portion and which is fitted into the opening in a state where the opening surface of the recessed portion is directed to the inside of the chassis and a second member having a protruding portion fitted into the recessed portion of the first member.

In a method for manufacturing an electronic device, according to one aspect, the electronic device has a chassis having an opening and a support containing a first elastic member having a recessed portion and a second member having a protruding portion configured to be fitted into the recessed portion, and the method includes a process of fitting the first member into the opening while the opening surface of the recessed portion of the first member is directed to the inside of the chassis and a process of fitting the protruding portion of the second member into the recessed portion of the first member.

According to these aspects, when the support is attached to the opening of the chassis of the electronic device, the first member of the support is first fitted into the opening so that the opening surface of the recessed portion is directed to the inside of the chassis. Since the first member has elasticity and has the recessed portion, the first member is elastically deformed in a direction where the recessed portion narrows to be able to be easily fitted into the opening. Next, the protruding portion of the second member of the support is fitted into the recessed portion. Thus, the support can be attached to the chassis by simple operations of the fitting of the first member into the opening and the fitting of the protruding portion of the second member into the recessed portion of the first member.

After the attachment, the opening surface of the recessed portion of the first member is directed to the inside of the chassis, and therefore the support is disposed so that the opposite surface of the recessed portion of the first member is directed to the outside of the chassis. The first member is elastic, and therefore supports the chassis cushion-wise. For example, the action of preventing slipping or rattling of the chassis or absorbing shock is demonstrated.

In addition, after the protruding portion of the second member is fitted into the recessed portion of the first member, the protruding portion of the second member prevents the elastic deformation of the first member in the direction where the recessed portion narrows, and therefore the first member fitted into the chassis can be prevented from falling off from the opening.

A support which is easily attached to and is less likely to separate from a chassis of an electronic device, an electronic device, and a method for manufacturing the same can be provided.

BRIEF DESCRIPTION OF THE DRAWINGS

FIGS. 3A to 3C are schematic views for explaining a support of FIG. 1, in which

FIGS. 4A and 4B are schematic views for explaining a state before the support of FIGS. 3A to 3C is fitted into an opening of the chassis of the electronic device, in which

FIGS. 5A and 5B are schematic views for explaining a state where a first member of the support of FIGS. 3A to 3C is fitted into to the opening, in which

FIGS. 6A and 6B are schematic views for explaining a state where a protruding portion of a second member of the support of FIGS. 3A to 3C is fitted into a recessed portion of the first member, in which

FIGS. 7A to 7C are schematic views for explaining a support according to a second embodiment, in which

FIGS. 8A and 8B are schematic views for explaining a state where the protruding portion of the second member of the support of FIGS. 7A to 7C is fitted into the recessed portion of the first member, in which

DETAILED DESCRIPTION OF THE INVENTION

Preferable embodiments of the present invention are described with reference to the accompanying drawings. A support of an aspect of the present invention is applicable to the bottom surface of chassis of various kinds of electronic devices, such as a notebook type personal computer (hereinafter referred to as a Laptop PC), a desktop type personal computer, a server, a tablet computer, and the like, for example.

In the following embodiments, a description is given using an example in which the support of the present invention is applied to the bottom surface of a chassis of a Laptop PC. In the following figures, the same or similar members are designated by the same reference numerals.

(First Embodiment)

Figure 1:
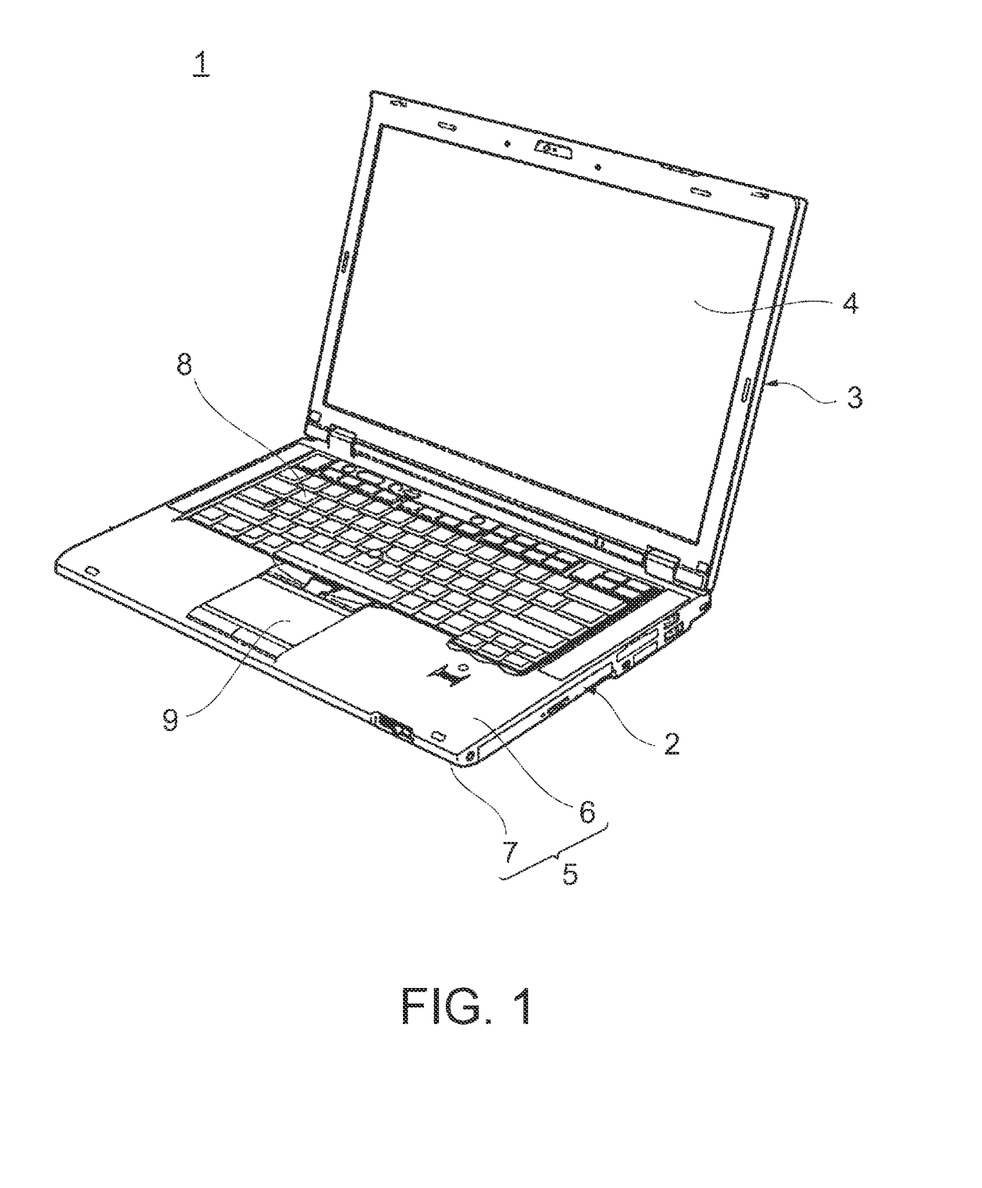
FIG. 1 is a perspective view of an electronic device having a support according to a first embodiment.

As illustrated in FIG. 1, a Laptop PC 1 has a body 2 and a lid 3 which is hinge-connected to the rear end of the body 2 and is openable/closable to the body 2. On the surface facing the body 2 of the lid 3, a liquid crystal display 4, for example, displaying various kinds of information is provided.

The body 2 has a chassis 5 of a flat box shape. The chassis 5 is configured by attaching an upper surface cover 6 and a bottom surface cover 7 in such a manner as to face each other. The chassis 5 contains a substrate, a CPU, a memory, an HDD, an SDD, a battery, and the like which are not illustrated (hereinafter referred to as "internal parts, such as a substrate") thereinside. On the side of the upper surface cover 6 of the chassis 5, input means, such as a keyboard 8 and a touchpad 9, are provided.

Figure 2:
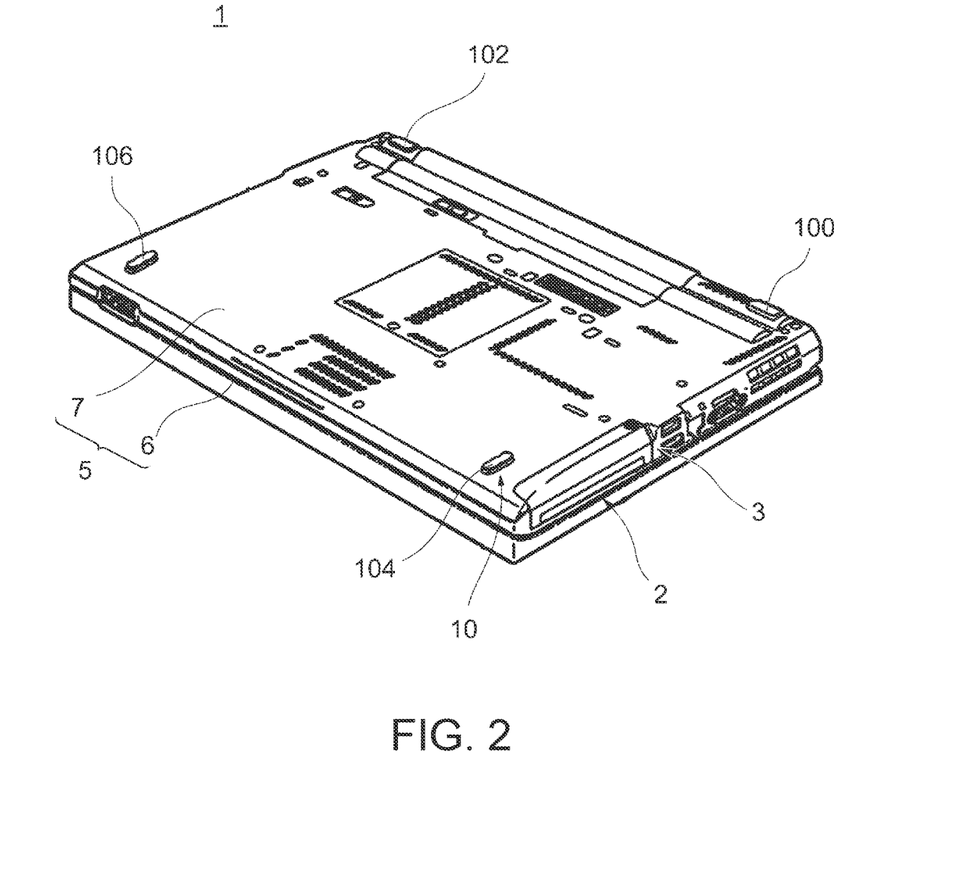
FIG. 2 is a perspective view of the electronic device of FIG. 1 in which a lid is closed as viewed from the bottom surface side.

As illustrated in FIGS. 2A and 2B, supports 100, 102, 104, and 106 (hereinafter collectively referred to as "support 10") are individually attached to the four corners of the bottom surface cover 7 of the chassis 5 of the Laptop PC 1. The supports 100 and 102 are attached to the rear end side (side hinge-connected to the lid 3) of the bottom surface cover 7 so that the longitudinal direction thereof is directed to the right and left direction of the chassis 5. The supports 104 and 106 are attached to the front end side of the bottom surface cover 7 so that the longitudinal direction is directed to the forward and backward direction of the chassis 5. The arrangement number, the arrangement places, the arrangement directions, and the like of the support 10 in the Laptop PC 1 can be changed as appropriate.

The support 10 projects to the outside relative to the bottom surface cover 7. When the Laptop PC 1 is placed on a placement surface, such as a flat desk, only the support 10 contacts the placement surface. The support 10 is formed of elastic materials, such as rubber, for example, and functions as a rubber leg of the Laptop PC 1. More specifically, the support 10 has functions of (1) preventing rattling between the Laptop PC 1 and the placement surface and damages on the placement surface, (2) forming a gap between the placement surface and the bottom surface cover 7 of the Laptop PC 1 to facilitate the circulation of the air inside and outside the chassis 5, and (3) absorbing shock to be applied to the chassis 5 of the Laptop PC 1.

Figures 3A, 3B, 3C:
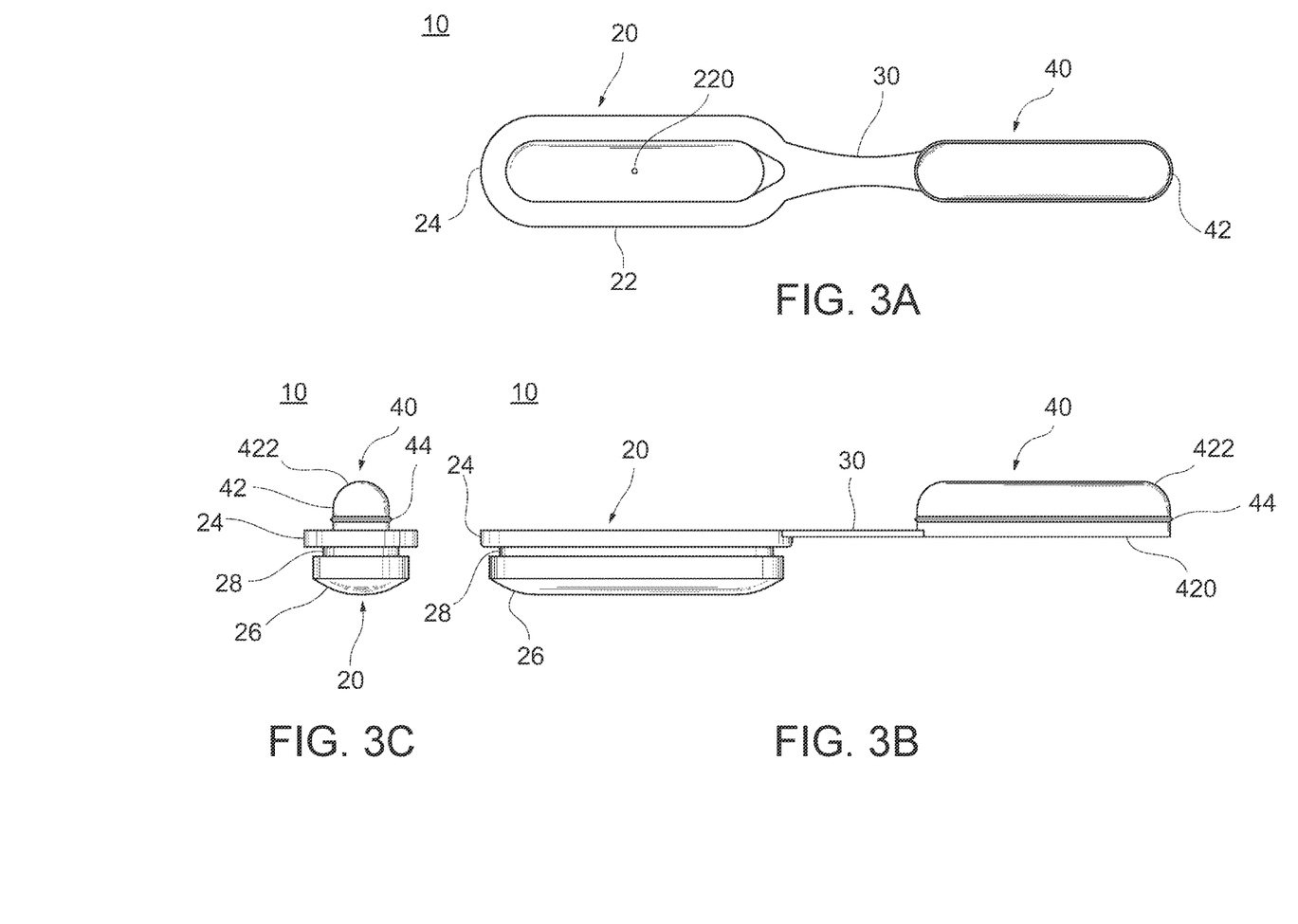
FIG. 3A is a plan view.
FIG. 3B is a front view.
FIG. 3C is a left side view.

Next, the support 10 is described in detail with reference to FIGS. 3A to 3C. As illustrated in FIGS. 3A to 3C, the support 10 is configured by connecting a first member 20, a connection member 30, and a second member 40 in this order in the longitudinal direction. The support 10 is formed of elastic materials, such as rubber, for example, and is formed by pouring a melted nitrile rubber (NBR) into a die, followed by integral molding. More specifically, the first member 20, the connection member 30, and the second member 40 form a monolithically molded article containing the same elastic material.

The first member 20 is a portion to be fitted into an opening provided in the bottom surface cover 7 and the size thereof is determined according to the size of the opening. The first member 20 contains a long and narrow recessed portion 22 provided in the center, a long and narrow flange 24 provided in such a manner as to surround the opening surface of the recessed portion 22, a bottom surface 26 having a substantially bowl shape and serving as the placement surface, and a groove 28 formed over the periphery of the first member 20 between the flange 24 and the bottom surface 26. The bottom surface 26 is a part of the peripheral surface of the first member 20 and is formed on the side opposite to the opening surface of the recessed portion 22.

In the center of the bottom surface of the recessed portion 22, a hole 220 (communication portion) having a very small diameter communicating to the bottom surface 26 is formed. The hole 220 functions as an air hole releasing the air when the second member 20 is fitted into the recessed portion 22. The position and the number of the hole 220 in the recessed portion 22 can be set as appropriate and another communication portion, such as a slit, instead of the hole 220 may be acceptable.

The connection member 30 is a thin plate-like substance extending from one end in the longitudinal direction of the flange 24 of the first member 20 to one end in the longitudinal direction of the second member 40 and connects the first member 20 and the second member 40. The connection member 30 can be easily bent in substantially the center in the longitudinal direction. Since the first member 20 and the second member 40 are connected by the connection member 30, it is not necessary to separately prepare the first member 20 and the second member 40 in the attachment, which can prevent the loss of one member.

The second member 40 is a portion configured to be fitted into the recessed portion 22 of the first member 20. The second member 40 contains a protruding portion 42 having substantially the same shape as and a complementary shape with the recessed portion 22 of the first member and a rib 44 formed on the protruding portion 42.

Herein, the "substantially the same shape as and a complementary shape" refers to the fact that the outer surface shape defining the protruding portion 42 is substantially the same as the inner surface shape defining the recessed portion 22 and includes cases where the protruding portion 42 is slightly larger and slightly smaller than the recessed portion 22. In the case where the protruding portion 42 is slightly larger than the recessed portion 22, the protruding portion 42 slightly expands the recessed portion 22 when the protruding portion 42 is fitted into the recessed portion 22. Thus, the first member 20 is elastically deformed so as to expand outward, and therefore the fitting between the first member 20 and an opening 70 provided in the bottom surface cover 7 is further strengthened.

On the other hand, when the protruding portion 42 is slightly smaller than the recessed portion 22, it becomes easy to fit the protruding portion 42 of the second member 40 into the recessed portion 22 of the first member 20.

Figure 6A:
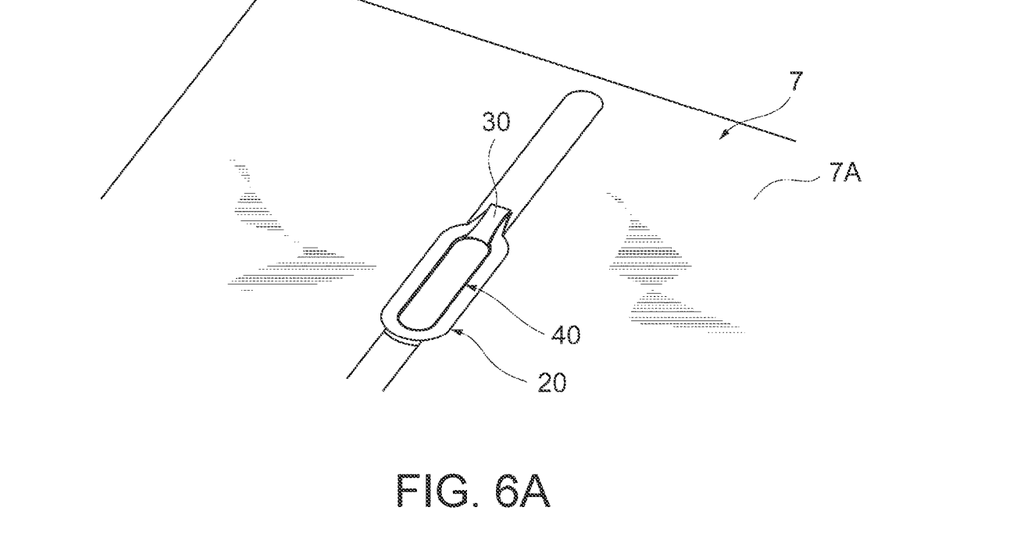
FIG. 6A is a perspective view and FIG. 6B is a cross-sectional view.
Figure 6B:
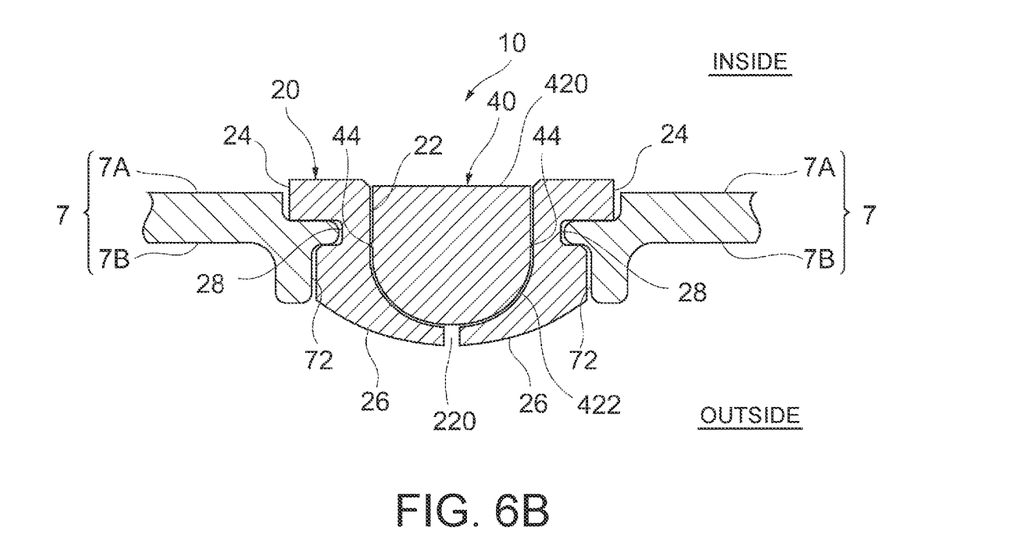

One end in the longitudinal direction of a bottom surface 420 of the protruding portion 42 is connected to the connection member 30. The bottom surface 420 is a flat surface and is located on a plane flush with the connection member 30 and the flange 24 of the first member 20 (FIG. 3B). More specifically, when the protruding portion 42 of the second member 40 is fitted into the recessed portion 22 of the first member 20, the bottom surface 420 configures a flat surface with the flange 24 (FIGS. 6A and 6B). An upper surface 422 of the protruding portion 42 has a dome shape in which the center is bulged in accordance with the bottom surface of the recessed portion 22 of the first member 20.

The rib 44 is formed over the periphery of the protruding portion 42 on a surface parallel to the bottom surface 420 and the upper surface 422 of the protruding portion 42. The rib 44 has a size that the rib 44 very slightly projects outward from the protruding portion 42. When the protruding portion 42 of the second member 40 is fitted into the recessed portion 22 of the first member 20, the rib 44 contacts the recessed portion 22 of the first member 20 to slightly expand the same. This makes it less likely for the protruding portion 42 of the second member 40 to fall off from the recessed portion 22 of the first member 20. When the projection length of the rib 44 is large, the first member 20 is elastically deformed so as to expand outward, which can further strengthen the fitting between the first member 20 and the bottom surface cover 7. The arrangement and the number of the rib 44 on the protruding portion 42 can be set as appropriate.

Next, a method for attaching the support 10 to the bottom surface cover 7 of the chassis 5 of the Laptop PC 1 is described with reference to FIGS. 4A and 4B to FIGS. 6A and 6B.

Figure 4A:
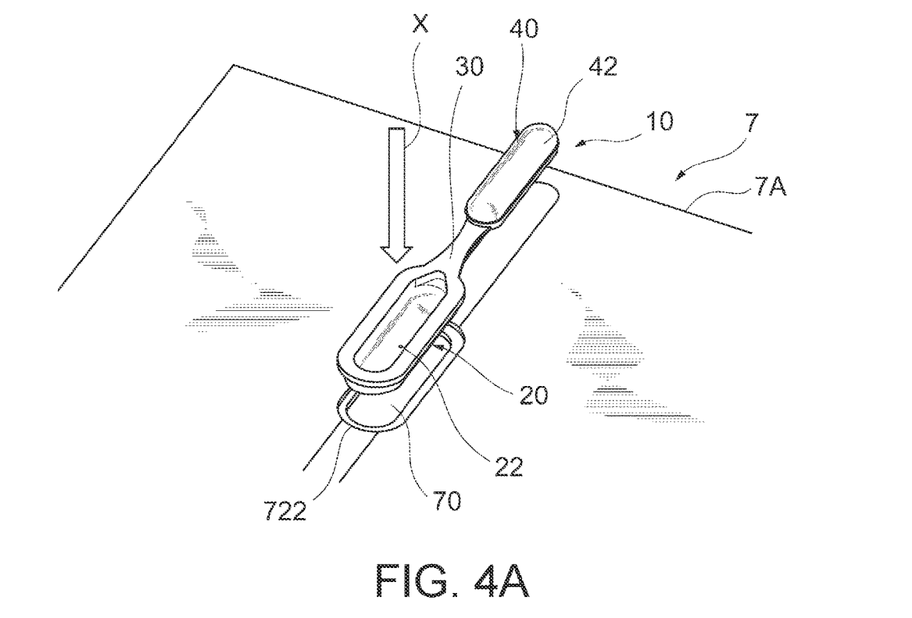
FIG. 4A is a perspective view and FIG. 4B is a cross-sectional view.
Figure 4B:
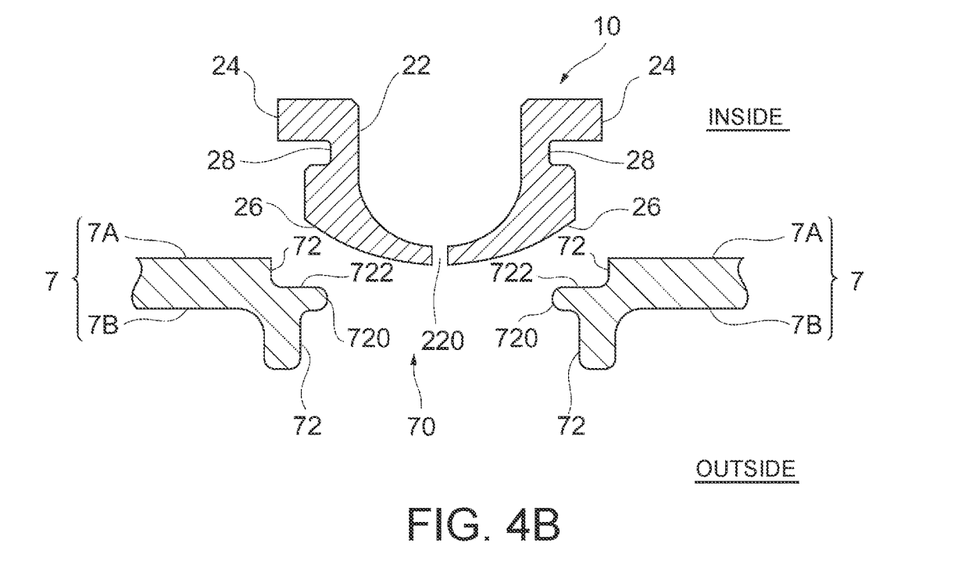

Herein, FIG. 4A is a schematic view illustrating a state before the support 10 is attached to the opening 70 provided in the bottom surface cover 7. FIG. 4B is a schematic view illustrating this state in the cross section in the lateral direction including the hole 220 of the support 10.

Figure 5A:
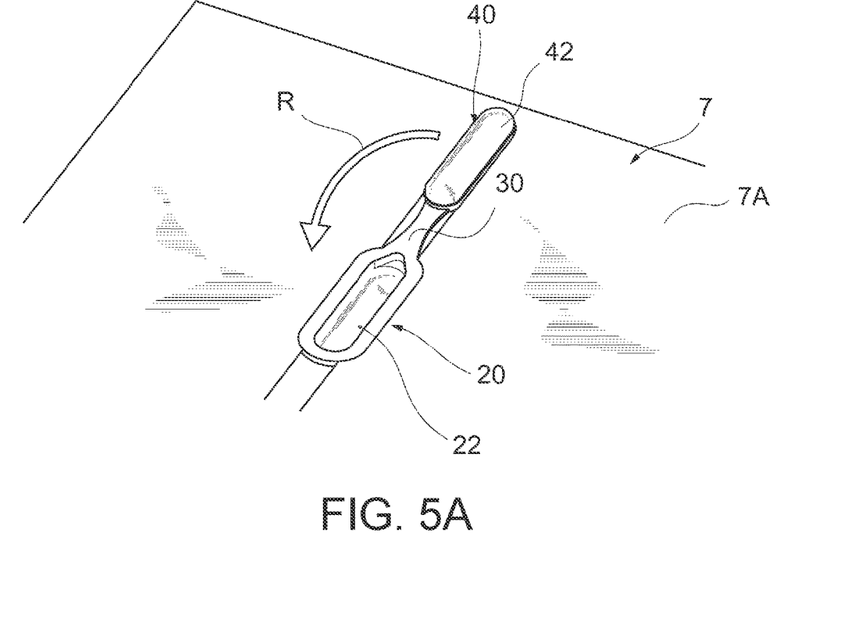
FIG. 5A is a perspective view and FIG. 5B is a cross-sectional view.
Figure 5B:
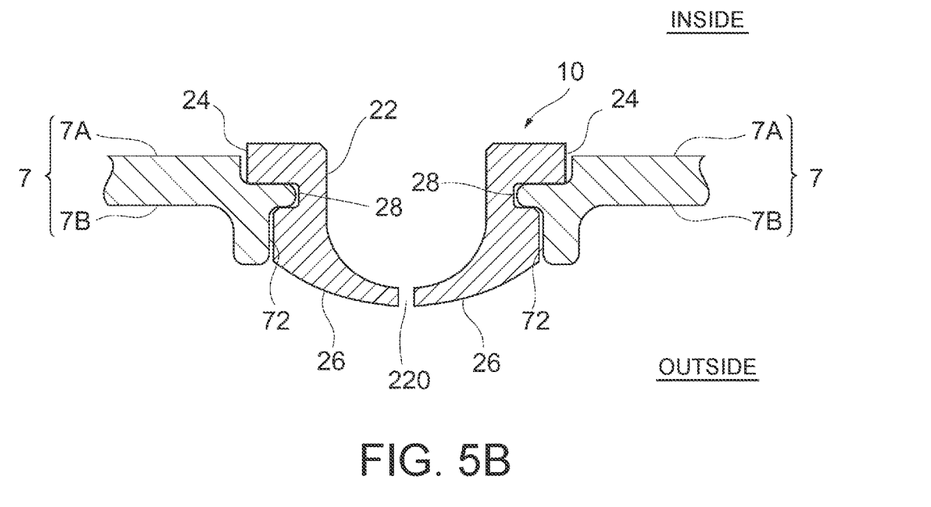

FIG. 5A is a schematic view illustrating a state after the support 10 is attached to the opening 70 provided in the bottom surface cover 7. FIG. 5B is a schematic view illustrating this state in the cross section in the lateral direction including the hole 220 of the support 10.

FIG. 6A is a schematic view illustrating a state after the second member 40 is fitted into the first member 20 of the support 10. FIG. 6B is a schematic view illustrating this state in the cross section in the lateral direction including the hole 220 of the support 10.

As illustrated in FIG. 4B, the opening 70 penetrating an inner surface 7A and an outer surface 7B is provided in the bottom surface cover 7. The inner surface 7A is a surface on the side facing the upper surface cover 6 when assembling the chassis 5 and is a surface defining the internal space (accommodation portion of internal parts, such as a substrate) of the chassis 5 with the upper surface cover 6. The outer surface 7B is a surface defining the bottom surface (placement surface) of the chassis 5. In the following description, the inner surface 7A side of the bottom surface cover 7 is also referred to as "inside" and the outer surface 7B side is also referred to as "outside".

An edge portion 72 defining the opening 70 is provided with a projection portion 720 projecting toward the central axis of the opening 70 and a flat portion 722 formed on the internal surface of the projection portion 720.

First, the bottom surface cover 7 and the support 10 are prepared, and then the support 10 is disposed inside the opening 70 of the bottom surface cover 7 as illustrated in FIGS. 4A and 4B. More specifically, the support 10 is disposed so that the opening surface of the recessed portion 22 of the first member 20 of the support 10 is directed to the inside and the bottom surface 26 is directed to the outside (opening 70 side).

In this state, the support 10 is moved in a direction indicated by the arrow X, so that the first member 20 is pressed into the opening 70. The first elastic member 20 has the recessed portion 22, and therefore is elastically deformed in the direction where the recessed portion 22 narrows. Therefore, the groove 28 of the first member 20 can be easily engaged in the projection portion 720 of the bottom surface cover 7. At this time, the flange 24 of the first member 20 abuts on the flat portion 722 of the bottom surface cover 7, which regulates further movement of the support 10. This facilitates the positioning of the bottom surface cover 7 of the first member 20 to the opening 70 and makes it less likely for the support 10 to fall off on the outside of the bottom surface cover 7 after the attachment.

Thus, the first member 20 of the support 10 is fitted into the opening 70 of the bottom surface cover 7 (FIGS. 5A and 5B). At this time, the bottom surface 26 of the first member 20 of the support 10 projects to the outside of the bottom surface cover 7 (FIG. 5B).

Next, the connection member 30 is bent at the center thereof, the second member 40 of the support 10 is moved in a direction indicated by the arrow R, and then the protruding portion 42 of the second member 40 is pressed into the recessed portion 22 of the first member 20 as illustrated in FIG. 5A. The second member 40 may be elastically deformed so as to be easily pressed into the recessed portion 22.

The hole 220 is provided in the recessed portion 22 of the first member 20. Therefore, the air in the recessed portion 22 of the first member 20 pressed out by the protruding portion 42 of the second member 40 is released from the hole 220, so that the reaction force of the air in the pressing is reduced. Therefore, the protruding portion 42 of the second member 40 can be easily fitted into the recessed portion 22 of the first member 20, which increases the workability of the attachment.

When the second member 40 of the support 10 is fitted into the first member 20, the rib 44 of the second member 40 abuts on or bites into the surface of the recessed portion 22 of the first member 20. This makes it less likely for the protruding portion 42 of the second member 40 to fall off from the recessed portion 22 of the first member 20. When the projection length of the rib 44 is large, the first member 20 is elastically deformed so as to expand outward, which can further strengthen the fitting between the first member 20 and the bottom surface cover 7. Thus, the attachment of the support 10 to the bottom surface cover 7 is completed (FIGS. 6A and 6B).

After the attachment of the support 10 to the bottom surface cover 7, internal parts, such as a substrate, and the upper surface cover 6 are attached to the bottom surface cover 7 to assemble the chassis 5.

Herein, the support 10 (the flange 24 of the first member 20, the connection member 30, and the bottom surface 420 of the protruding portion 42 of the second member 40) is located on a plane substantially flush with the inner surface 7A of the bottom surface cover 7 as illustrated in FIGS. 6A and 6B. Therefore, the internal parts, such as a substrate, can be disposed so as to abut on the support 10 when assembling the chassis 5. In this case, the internal parts, such as a substrate, can regulate the movement of the support 10 and the movement of the second member 40 to the first member 20. Thus, the support 10 can be prevented from separating from the bottom surface cover 7 or the second member 40 of the support 10 can be prevented from separating from the first member 20.

As illustrated in FIG. 6B, the recessed portion 22 of the first member 20 and the protruding portion 42 of the second member 40 have substantially the same shape and a complementary shape with each other and the protruding portion 42 of the second member 40 is closely stuck to the recessed portion 22 of the first member 20 with no gap to be fitted thereinto. Therefore, after the attachment of the support 10 to the bottom surface cover 7 (after the fitting of the protruding portion 42 of the second member 30), the elastic deformation of the first member 20 including the groove 28 is prevented. This can prevent the separation of the first member 20 fitted into the bottom surface cover 7 from the opening 70.

For example, when the chassis 5 of the Laptop PC 1 is placed on a desk or the like, the first member 20 of the support 10 projecting from the bottom surface of the chassis 5 functions as a rubber leg. At this time, the pressing force from the outside to the inside of the chassis 5 is applied to the first member 20 of the support 10. However, the elastic deformation of the first member 20 including the groove 28 is prevented by the protruding portion 42 of the second member 40 as described above, and therefore the separation of the support 10 from the bottom surface cover 7 of the chassis 5 can be prevented.

(Second Embodiment)

Next, a support 10A according to a second embodiment of the present invention is described with reference to FIGS. 7A to 7C and FIGS. 8A and 8B. In the support 10A, the shapes of a recessed portion of a first member and a protruding portion of a second member are different from each other. In this point, the support 10A is different from the support 10 of the first embodiment in which the portions have substantially the same shape and a complementary shape with each other. The other configurations of the support 10A are substantially the same as the configurations of the support 10 and are designated by the same reference numerals and designations, and thus a description thereof is omitted.

Figure 7A:
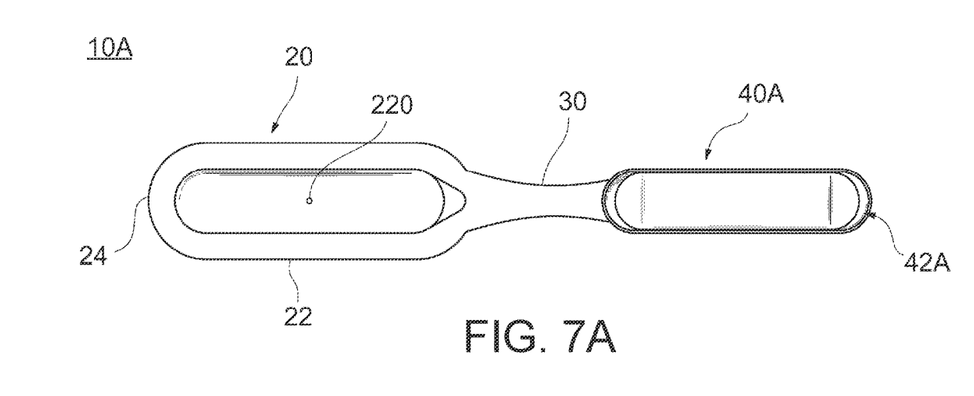
FIG. 7A is a plan view.
Figure 7B:
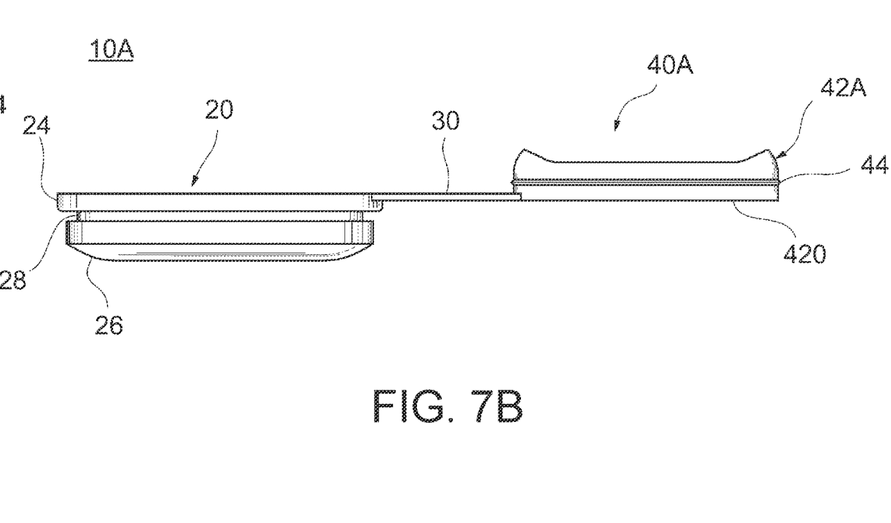
FIG. 7B is a front view.
Figure 7C:
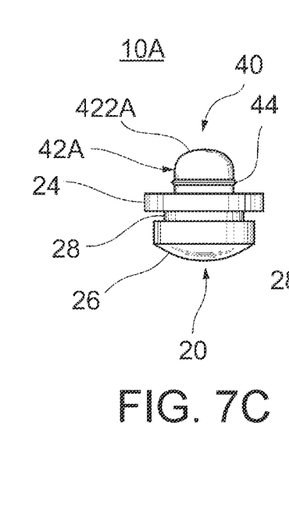
FIG. 7C is a left side view.

As illustrated in FIGS. 7A and 7B, a second member 40A of the support 10A is different in the shape from the recessed portion 22 of the first member 20 and has a shape in which an upper surface 422A of a protruding portion 42A is recessed to the central inner side except both ends in the longitudinal direction (On the other hand, in the support 10 of the first embodiment, the upper surface 422 of the protruding portion 42 of the second member 40 has the dome shape in which the center is bulged in accordance with the bottom surface of the recessed portion 22 of the first member 20 as illustrated in FIGS. 3A to 3C.). Therefore, a material for use in the protruding portion 42A can be reduced as compared with a material for the protruding portion 42 of the first embodiment.

Figure 8A:
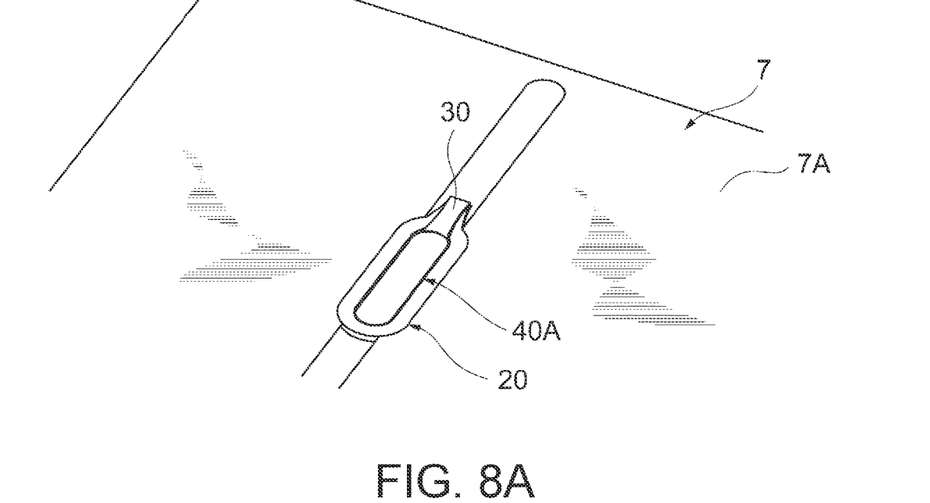
FIG. 8A is a perspective view and FIG. 8B is a cross-sectional view.
Figure 8B:
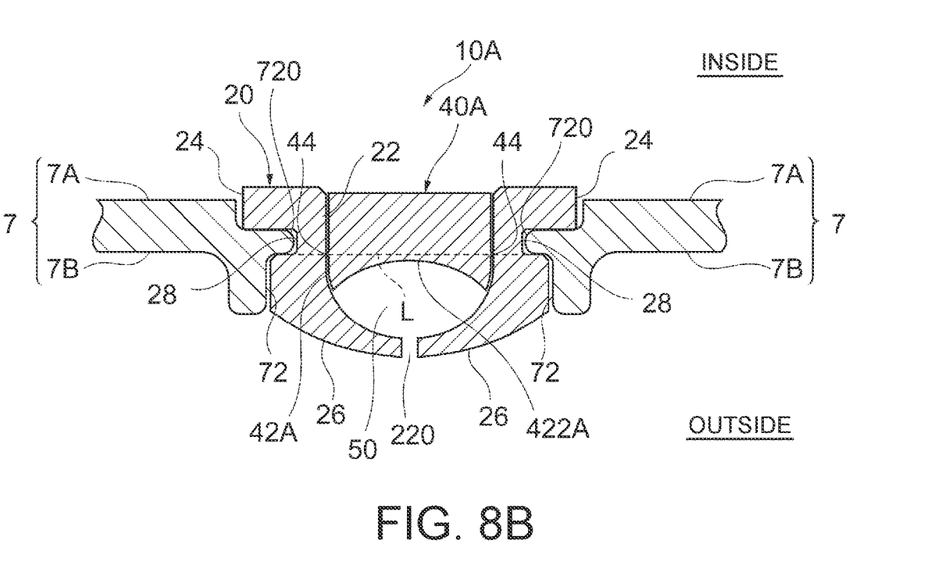

FIG. 8A is a schematic view illustrating a state after the protruding portion 42A of the second member 40A is fitted into the recessed portion 22 of the first member 20. FIG. 8B is a schematic view illustrating this state in the cross section in the lateral direction including the hole 220 of the support 10A.

As illustrated in FIG. 8B, when the protruding portion 42A of the second member 40A is fitted into the recessed portion 22 of the first member 20, a void portion 50 is formed between the recessed portion 22 and the upper surface 422A of the protruding portion 42A. The void portion 50 functions as an air spring.

For example, when the chassis 5 of the Laptop PC 1 is placed on a desk or the like, the pressing force from the outside to the inside of the chassis 5 is applied to the first member 20 of the support 10A. At this time, the void portion 50 is formed between the first member 20 and the second member 40A, and therefore the bottom surface 26 of the first member 20 can be elastically deformed in a direction from the outside to the inside of the chassis 5 and in the opposite direction. This improves the shock absorbability of the support 10A.

The elastic deformation does not cause the separation of the support 10A from the bottom surface cover 7 of the chassis 5. As illustrated in FIG. 8B, the protruding portion 42A of the second member 40A is fitted into a deeper side than a position facing the groove 28 of the recessed portion 22. In other words, the void portion 50 is formed on the outer side (position close to the outside of the chassis 5) than a plane (dotted line L) formed by the groove 28. Therefore, even when the bottom surface 26 of the first member 20 is elastically deformed, the protruding portion 42A of the second member 40A prevents the elastic deformation of the groove 28 of the first member 20. This can prevent the separation of the support 10A from the bottom surface cover 7 of the chassis 5.

(Modification)

The above-described embodiments are examples for describing the present invention. It is not intended that the present invention is limited only to the embodiments. The present invention can be variously modified without deviating from the scope thereof.

(A) Shapes of First Member and Second Member

The shapes of the first member and the second member of the above-described aspects of the present invention can be changed to a rectangular parallelepiped, an oval, a cone, a hemisphere, a sphere, and a combination thereof, and the like as appropriate corresponding to the attachment portion, the attachment number, required load bearing performance, and the like of the support.

Figure 9:
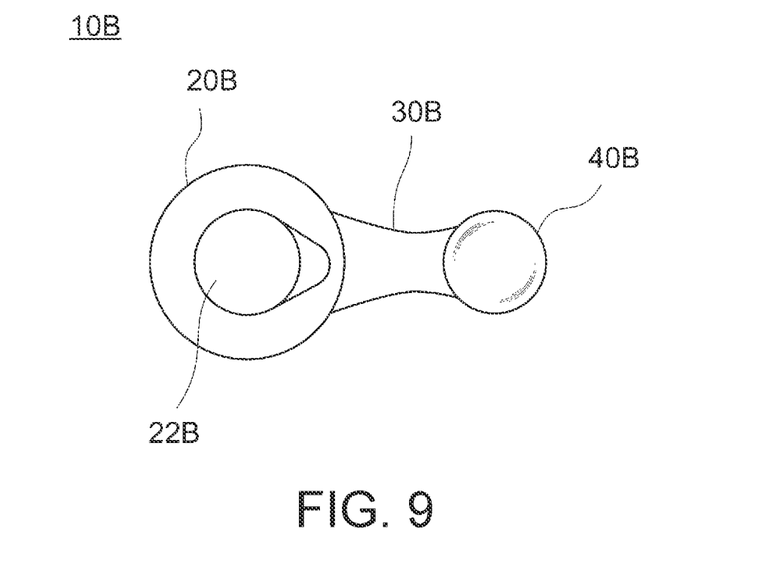
FIG. 9 is a plan view schematically illustrating a support according to a modification.

For example, as in a support 10B according to a modification of FIG. 9, a substantially hemispherical first member 20B having a substantially hemispherical recessed portion 22B and a second member 40B having a hemispherical protruding portion 42B may be connected by a connection member 30B. The shape of the support 10B in a state where the second member 40B is fitted into the first member 20B (state where the support 10B is attached to the bottom surface cover 7) is also a substantially hemispherical shape.

(B) Material of Second Member

A material of the second member of the above-described aspects of the present invention may be different from a material of the first member. For example, an elastic body having rigidity higher than that of the first member and an inelastic body, such as metal, may be used. In this case, the elastic deformation of the first member after the second member is fitted into the recessed portion of the first member can be further prevented.

(C) Air Hole

The above-described embodiments describe the example in which the hole 220 is provided in the recessed portion 22 of the first member 20. However, a means releasing the air when the protruding portion of the second member is fitted into the recessed portion of the first member is not limited thereto.

For example, a hole penetrating the bottom surface and the upper surface of the protruding portion of the second member may be provided. Moreover, for example, a slit may be provided in the surface of the recessed portion of the first member or the surface of the protruding portion of the second member, so that the air may be pressed out to the outside through the slit when the protruding portion of the second member is fitted into the recessed portion of the first member. A hole may not be provided in the first member 20B and the second member 40B as in the support 10B illustrated in FIG. 9.

(D) Configuration of Connection Member

The configuration of the connection member can also be altered as appropriate. For example, the above-described embodiments describe the example in which the first member 20 and the second member 40 are connected in the longitudinal direction through the connection member 30 but the present invention is not limited thereto.

Figure 10:
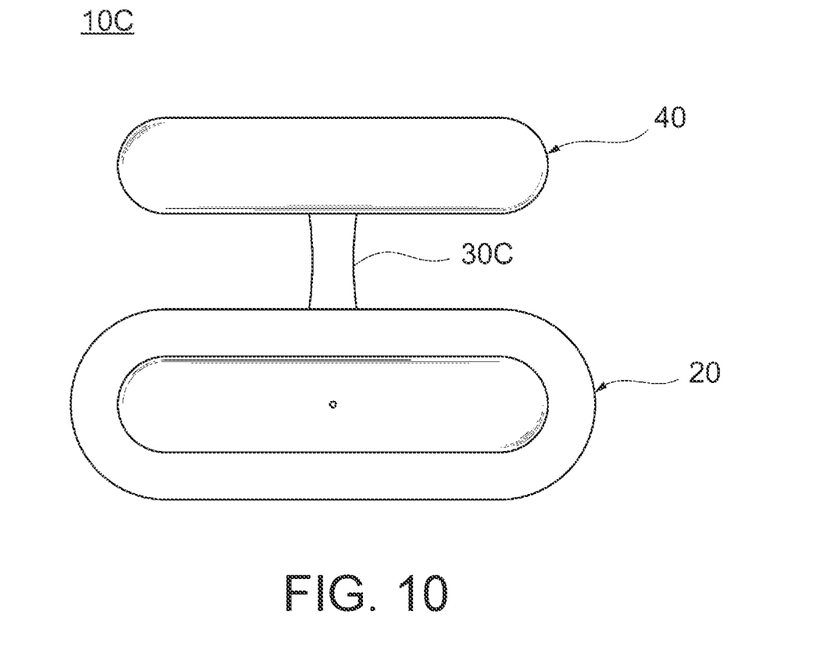
FIG. 10 is a plan view schematically illustrating a support according to a modification.

For example, the first member 20 and the second member 40 may be connected in the lateral direction through a connection member 30C as in a support 10C according to a modification illustrated in FIG. 10. Thus, the support 10C can be made compact (The length in the longitudinal direction can be reduced).

Figure 11:
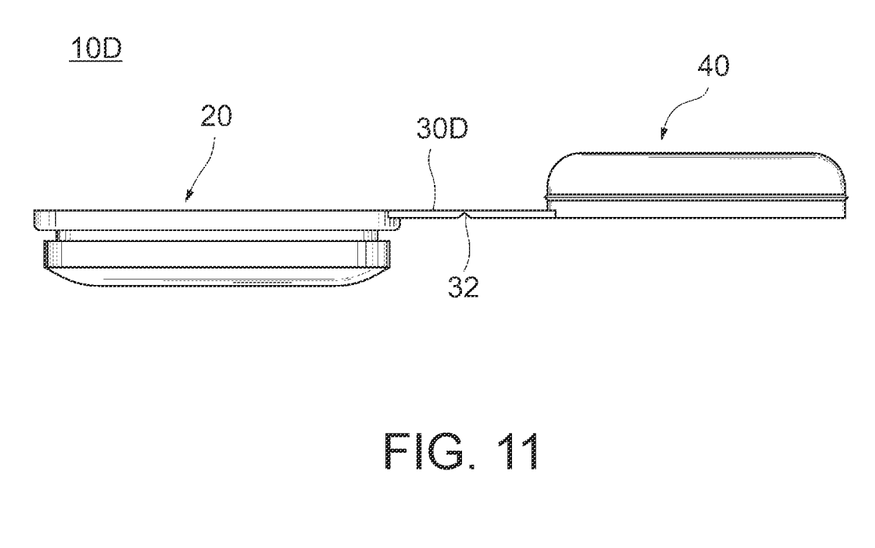
FIG. 11 is a plan view schematically illustrating a support according to a modification.

Moreover, for example, a notch 32 may be provided substantially in the center in the longitudinal direction of a connection member 30D as in a support 10D according to a modification illustrated in FIG. 11. The notch 32 facilitates the bending of the connection member 30D when the protruding portion of the second member is fitted into the recessed portion of the first member. When the protruding portion of the second member is fitted into the recessed portion of the first member, the connection member 30D may be cut by the notch 32. This can prevent the bent connection portion from disturbing the arrangement of the other members in the chassis 5.

(E) Accommodation Portion of Connection Member

An accommodation portion of the connection member may be provided in the recessed portion of the first member or on the protruding portion of the second member so as to entirely or partially accommodate the connection member when the protruding portion of the second member is fitted into the recessed portion of the first member. Thus, a portion where the connection member protrudes toward the inside of the chassis when the support is attached to the chassis can be reduced or eliminated, so that the connection member can be prevented from disturbing the arrangement of the other members in the chassis.

(F) Configuration in Which First Member and Second Member are Provided in Separate Bodies Although the above-described embodiments describe the example in which the first member and the second member are connected by the connection member, the first member and the second member may be provided as separate bodies without providing the connection member in the support.

(G) Combined Use With Other Joint Means

Although the above-described embodiments describe the example in which the support is fitted into the opening of the chassis to be attached thereto without using an adhesive or the like, other joint means, such as an adhesive, may be used in combination for the groove or the recessed portion of the first member, the protruding portion of the second member, and the like when the support is fitted into the chassis.

The invention claimed is:

1. An electronic device comprising:
a chassis having an opening; and
a support, wherein the support has:
    a first elastic member which has a recessed portion and which can be fitted into the opening in a state where an opening surface of the recessed portion is directed to an inside of the chassis,
    a second member having a protruding portion which can be fitted into the recessed portion of the first member;
    a projection portion in an edge portion of the opening of the chassis, and
    the first elastic member has a groove to be engaged in the projection portion.

2. The electronic device according to claim 1, wherein:
the first elastic member has a flange for abutting on the edge portion of the opening of the chassis.

3. The electronic device according to claim 1, wherein:
the protruding portion of the second member is configured to face at least a groove of the recessed portion.

4. The electronic device according to claim 1, wherein:
the protruding portion of the second member has substantially a same shape as and a complementary shape with the recessed portion of the first elastic member.

5. The electronic device according to claim 1, wherein:
when the protruding portion of the second member is fitted into the recessed portion of the first elastic member, a void portion is formed between the recessed portion of the first elastic member and the protruding portion of the second member.

6. The electronic device according to claim 1, further comprising:
a rib for contacting the recessed portion is in the protruding portion of the second member.

7. The electronic device according to claim 1, further comprising:
a communication portion for communicating with an outside of the support in the recessed portion of the first elastic member or the protruding portion of the second member.

8. The electronic device according to claim 1, further comprising:
a connection member connecting the first elastic member and the second member.

9. The electronic device according to claim 8, wherein:
the connection member is bendable, and
when the connection member is bent, the protruding portion of the second member can be fitted into the recessed portion of the first elastic member.

10. The electronic device according to claim 8, wherein:
the first elastic member, the second member, and the connection member form a monolithically molded article.

11. The electronic device according to claim 8, wherein:
at least one of the first elastic member and the second member has an accommodation portion for accommodating the connection member in a state where the protruding portion of the second member is fitted into the recessed portion of the first elastic member.

* * * * *